US006668003B2

United States Patent
(12) United States Patent
Ungar

(10) Patent No.: US 6,668,003 B2
(45) Date of Patent: Dec. 23, 2003

(54) LASER DIODE ARRAY WITH AN IN-PHASE OUTPUT

(75) Inventor: Jeffrey E. Ungar, Valley Village, CA (US)

(73) Assignee: Quintessence Photonics Corporation, Sylmar, CA (US)

( * ) Notice: Subject to any disclaimer, the term of this patent is extended or adjusted under 35 U.S.C. 154(b) by 0 days.

(21) Appl. No.: 10/264,593

(22) Filed: Oct. 3, 2002

(65) Prior Publication Data

US 2003/0152124 A1 Aug. 14, 2003

Related U.S. Application Data

(60) Provisional application No. 60/357,011, filed on Feb. 12, 2002.

(51) Int. Cl.[7] .................................................. H01S 3/14

(52) U.S. Cl. ............................. 372/50; 372/46; 372/45

(58) Field of Search ............................. 372/46, 50, 43, 372/44, 64

(56) References Cited

U.S. PATENT DOCUMENTS 4,751,707 A * 6/1988 Krebs et al. .................. 372/44
4,757,268 A * 7/1988 Abrams et al. ............. 359/338
4,791,648 A * 12/1988 Vojak et al. .................. 372/46
5,953,359 A * 9/1999 Yamaguchi et al. .......... 372/50
6,025,060 A * 2/2000 Meissner .................... 428/220
6,289,032 B1 * 9/2001 Fay et al. ................... 372/102
6,480,513 B1 * 11/2002 Kapany et al. ............... 372/20
2002/0009274 A1 * 1/2002 Gharavi ...................... 385/122

* cited by examiner

*Primary Examiner*—Paul Ip
*Assistant Examiner*—Dung T Nguyen
(74) *Attorney, Agent, or Firm*—Irell & Manella LLP

(57) ABSTRACT

A laser diode array that includes a plurality of laser stripes each separated by an unpumped region. The array includes at least one first laser stripe and at least one second laser stripe. The first laser stripe emits a first laser beam. The second laser stripe emits a second laser beam. A phase shifter is connected to the stripes so that the phase of the second laser beam is shifted to be in phase with first laser beam. The resultant output beam of the array is a high power, high quality, diffraction limited beam.

12 Claims, 2 Drawing Sheets

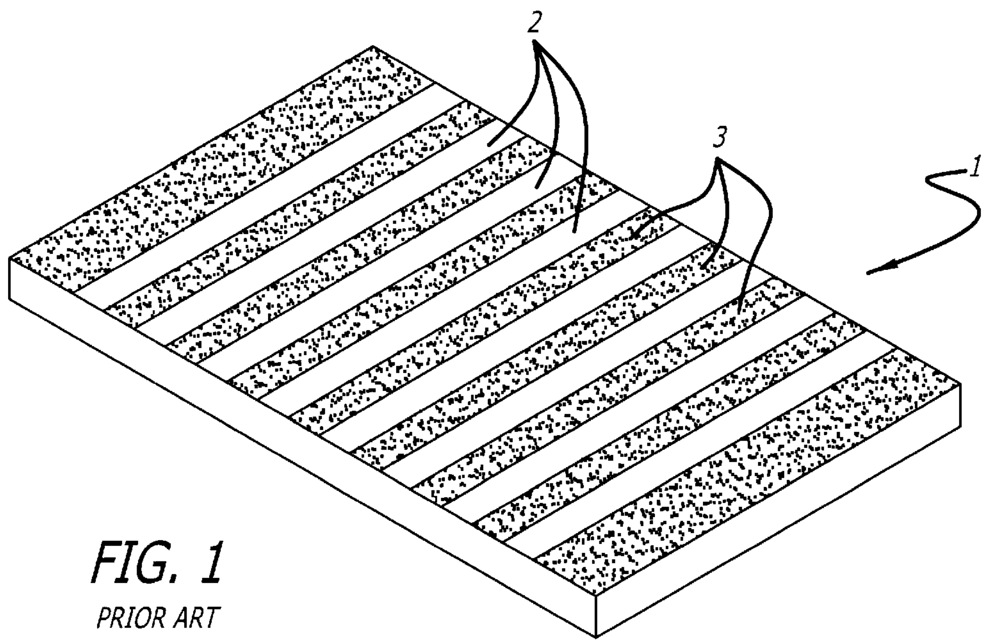
FIG. 1
PRIOR ART
INTENSITY PROFILE
IN-PHASE MODE
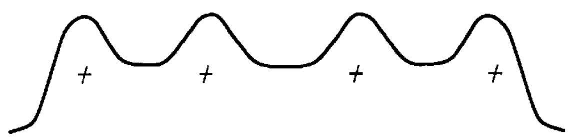
FIG. 2
PRIOR ART
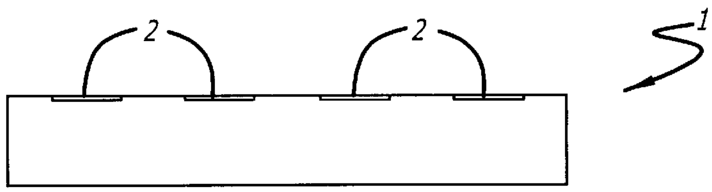

LASER DIODE ARRAY WITH AN IN-PHASE OUTPUT

REFERENCE TO CROSS RELATED APPLICATION

This application claims priority under 35 U.S.C. §119(e) to provisional Application No. 60/357,011 filed on Feb. 12, 2002.

BACKGROUND OF THE INVENTION

1. Field of the Invention

The subject matter disclosed generally relates to the field of semiconductor lasers.

2. Background Information

Semiconductor lasers are used in a variety of system applications. For example, semiconductor lasers are used as a light source in fiber optic communication systems. It is generally desirable to provide a semiconductor laser that has a high power output. High power output reduces the number of repeaters and amplifiers required for the optical system.

FIG. 1 shows a laser diode array 1 that contains a plurality of laser stripes 2 each separated by an unpumped region 3. Each laser stripe 2 emits a laser beam. Collectively, the laser stripes 2 increase the power output of the device 1.

The laser stripes 2 are formed in relative close proximity to each other. Consequently, there is a coupling between stripes 2 due to the electromagnetic fields emitted by the laser beams formed therein. This coupling creates various operating modes.

As shown in FIG. 2 the stripes may be coupled in a coherent "supermode" where adjacent stripes operate in-phase. The in-phase supermode creates a high power, high quality diffraction limited output beam.

Unfortunately, most laser diode arrays operate in an anti-phase supermode where adjacent stripes are 180 degrees out of phase from each other. The anti-phase supermode is shown in FIG. 3. In the anti-phase supermode, the intensity profile more closely matches the amplification gain profile of the array, where both gain and light intensity are at a minimum in the unpumped regions that separate the stripes. This matching of intensity and gain tends to induce the array to operate in the anti-phase supermode.

The resultant output beam of a laser diode array operating in the anti-phase supermode has a double peak rabbit ear shape with minimums at 0 degrees. Such a waveform is difficult to focus and is essentially useless for applications that require a high quality, diffraction limited beam.

BRIEF SUMMARY OF THE INVENTION

A laser diode array that includes two or more laser stripes. The laser diode array also includes a phase shifter appended to every second laser stripe.

BRIEF DESCRIPTION OF THE DRAWINGS

FIG. 1 is an illustration of a laser diode array of the prior art;

FIG. 2 is an illustration of the laser diode array of the prior art operating in an in-phase supermode;

DETAILED DESCRIPTION

Disclosed is a laser diode array that includes a plurality of laser stripes each separated by an unpumped region. The array includes at least one first laser stripe and at least one second laser stripe. The first laser stripe emits a first laser beam. The second laser stripe emits a second laser beam. A phase shifter is connected to the stripes so that the phase of the second laser beam is shifted to be in phase with first laser beam. The resultant output beam of the array is a high power, high quality, diffraction limited beam.

Figure 3:
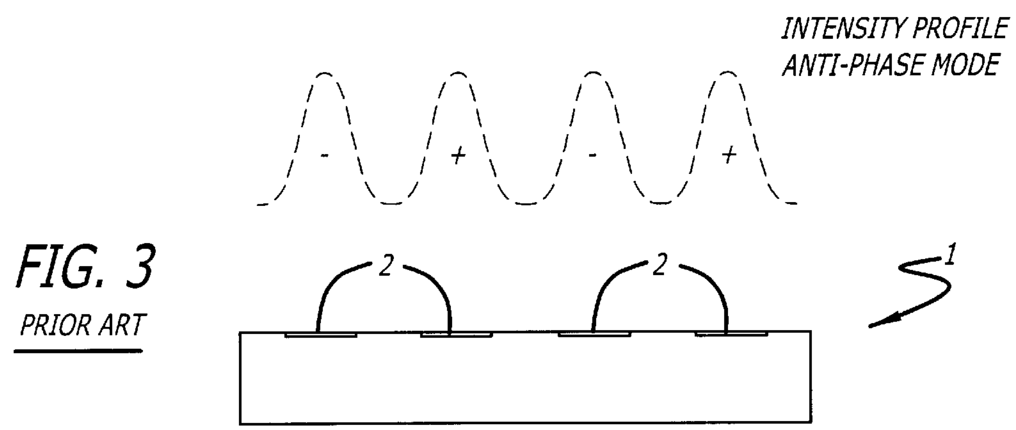
FIG. 3 is an illustration of the laser diode array of the prior art operating in an anti-phase supermode.
Figure 4:
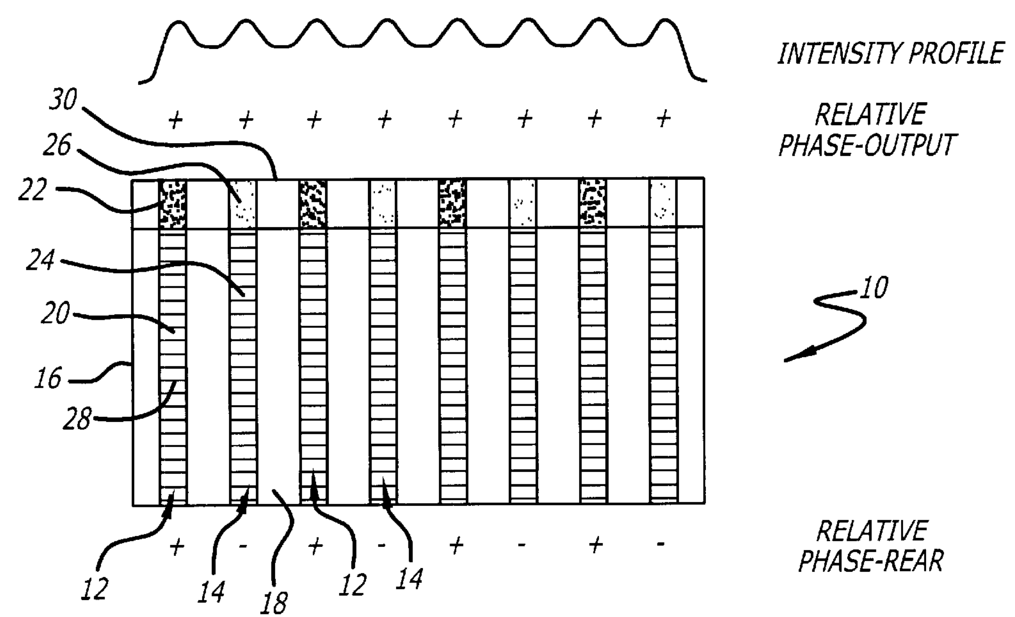
FIG. 4 is an illustration of an embodiment of a laser diode array of the present invention.

Referring to the drawings more particularly by reference numbers, FIG. 4 shows a laser diode array 10. The laser diode array 10 includes a plurality of first laser stripes 12 and a plurality of second laser stripes 14. The stripes 12 and 14 may be active pumped laser sections formed on a substrate 16 and separated by unpumped regions 18. The first laser stripes 12 each emit a first laser beam that has a phase. The second laser stripes 14 each emit a second laser beam that has a phase.

Each first laser stripe 12 may include a distributed feedback section 20 and a waveguide section 22. Likewise, each second laser stripe 14 may include a distributed feedback section 24 and a waveguide section 26. The distributed feedback sections 20 and 24 may each include a diffraction grating 28 and a gain layer (not shown) that generate a laser beam. Distributed feedback is preferred, because unlike Fabry-Perot cavities, such resonators do not require reflectors on the ends of the stripes 12 and 14. An anti-reflection coating can therefore be added to the front end 30 of the array 10. It is to be understood that other means for generating feedback such as Bragg reflectors may be integrated into the array.

The first 12 and second stripes 14 are typically in close proximity so that the feedback sections 20 and 24 operate in a coupled anti-phase supermode, as indicated by the polarity on the rear portion of the array 10 depicted in FIG. 4. The waveguide sections 26 of the second stripes 14 have a higher index of refraction than the waveguide sections 24 of the first stripes, so that the phase of the second laser beams is retarded and shifted to be in phase with the first laser beams. By way of example, the second laser beams are typically shifted 180 degrees.

As shown in FIG. 4 phase shifting the second laser beams creates an in-phase supermode. The resultant output beam of the array 10 is a high power, high quality, diffraction limited beam. By way of example, the array 10 may produce an output beam with several watts of power.

The phase shifters 26 convert a laser diode array operating in an anti-phase supermode to an array with an in-phase resultant output beam. The in-phase beam can be more easily focused. For example, the array 10 can be used as a light source for a fiber optic communication network wherein the resultant output beam is focused into a fiber optic cable.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A laser diode array, comprising:

a substrate that has an output surface;

at least one first laser stripe located on said substrates;

at least one second laser stripe located on said substrate; and, at least one phase shifter located on said substrate between said second laser stripe and said output surface and optically coupled to said second laser stripe.

2. The array of claim 1, wherein said first and second laser stripes each output a laser beam and said phase shifter shifts the laser beam of said second laser stripe 180 degrees.

3. The array of claim 1, wherein said first and second laser stripes each include a distributed feedback section.

4. The array of claim 1, wherein said phase shifter is part of a waveguide that is connected to said first and second laser stripes, said waveguide having a first section connected to said first laser stripe and a second section connected to said second laser stripe, said second section having a higher index of refraction than said first section.

5. The array of claim 1, wherein said first and second laser stripes are separated by an un-pumped region.

6. A laser diode array, comprising:

first laser means for generating a first laser beam that has a phase;

second laser means for generating a second laser beam that has a phase; and, phase shifter means for shifting the phase of the second laser beam to be in phase with the first laser beam.

7. The array of claim 6, wherein said phase shifter means shifts the phase of the second laser beam 180 degrees.

8. The array of claim 6, wherein said first and second laser means each include a distributed feedback section.

9. The array of claim 6, wherein said phase shifter means includes a waveguide that is connected to said first and second laser means, said waveguide having a first section connected to said first laser means and a second section connected to said second laser means, said second section having a higher index of refraction than said first section.

10. The array of claim 6, wherein said first and second laser means are separated by an un-pumped region.

11. A method for operating a laser diode array, comprising:

generating a first laser beam from a first laser stripe, the first laser beam having a phase;

generating a second laser beam from a second laser stripe, the second laser beam having a phase; and, shifting the phase of the second laser beam to be in phase with the first laser beam.

12. The method of claim 11, wherein the phase of the second laser beam is shifted 180 degrees.

* * * * *